(12) United States Patent
Lorenzon et al.

(10) Patent No.: US 9,054,711 B2
(45) Date of Patent: Jun. 9, 2015

(54) FREQUENCY DIVIDER

(75) Inventors: Leonardo Lorenzon, Fontane di Villorba (IT); Andrea Bevilacqua, Padua (IT); Nicola DaDalt, Villach (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 215 days.

(21) Appl. No.: 12/497,393

(22) Filed: Jul. 2, 2009

(65) Prior Publication Data

US 2011/0001521 A1    Jan. 6, 2011

(51) Int. Cl.
| | |
|---|---|
| *H03K 21/00* | (2006.01) |
| *H03K 23/00* | (2006.01) |
| *H03K 25/00* | (2006.01) |
| *H03K 23/52* | (2006.01) |
| *H03K 23/54* | (2006.01) |

(52) U.S. Cl.
CPC .............. *H03K 23/52* (2013.01); *H03K 23/542* (2013.01); *H03K 23/544* (2013.01)

(58) Field of Classification Search
USPC ......... 327/115, 116, 117, 118, 355–360, 202, 327/203, 208–212, 218; 377/47, 48
See application file for complete search history.

(56) References Cited

U.S. PATENT DOCUMENTS

| | | | |
|---|---|---|---|
| 6,163,224 A * | 12/2000 | Araki et al. ....................... 331/34 |
| 6,175,285 B1 * | 1/2001 | Gabara ..................... 331/117 R |
| 6,188,291 B1 * | 2/2001 | Gopinathan et al. ............ 331/45 |
| 6,708,026 B1 | 3/2004 | Klemmer et al. |
| 6,842,078 B2 | 1/2005 | Manna et al. |
| 7,138,879 B2 | 11/2006 | Su |
| 7,391,275 B2 | 6/2008 | Jordy et al. |
| 7,522,007 B2 | 4/2009 | Jang et al. |
| 7,522,008 B2 | 4/2009 | Jang et al. |
| 2003/0076179 A1 * | 4/2003 | Branch et al. .................... 331/57 |
| 2004/0189407 A1 * | 9/2004 | Manna et al. .................... 331/57 |
| 2005/0248410 A1 * | 11/2005 | Su .................... 331/16 |
| 2006/0197608 A1 * | 9/2006 | Sanchez et al. ................. 331/16 |
| 2007/0188248 A1 * | 8/2007 | Westra ........................ 331/36 C |
| 2008/0150646 A1 * | 6/2008 | Chen ............................. 331/143 |
| 2008/0231379 A1 * | 9/2008 | Jang et al. ....................... 331/57 |
| 2009/0033430 A1 * | 2/2009 | Jang et al. ....................... 331/57 |
| 2009/0167446 A1 * | 7/2009 | Higashi ........................... 331/57 |
| 2011/0187469 A1 * | 8/2011 | Okada et al. ............. 331/117 FE |
| 2012/0062293 A1 * | 3/2012 | Liang et al. .................... 327/157 |
| 2013/0002318 A1 * | 1/2013 | Lu et al. ......................... 327/156 |
| 2013/0058384 A1 * | 3/2013 | Otis et al. ....................... 375/219 |

OTHER PUBLICATIONS

Adler, "A Study of Locking Phenomena in Oscillators", Proceedings of the I.R.E. and Waves and Electrons, Jun. 1946, pp. 351-357.
Chien et al., "Analysis and Design of Wideband Injection-Locked Ring Oscillators With Multiple-Input Injection", IEEE Journal of Solid-State Circuits, vol. 42, No. 9, Sep. 2007, pp. 1906-1915.
Chuang et al., "A Wide Band Injection Locked Frequency Divider With Variable Inductor Load", IEEE Microwave and Wireless Components Letters, vol. 17, No. 6, Jun. 2007, pp. 460-462.

(Continued)

*Primary Examiner* — Brandon S Cole
(74) *Attorney, Agent, or Firm* — SpryIP, LLC

(57) ABSTRACT

This disclosure relates to a divide-by-N frequency divider system and frequency dividing method. The system includes a ring oscillator having M stages, where M is an integer, and a zero mean current component coupled to one or more of the stages to provide a zero mean current flow path.

10 Claims, 8 Drawing Sheets

(56) References Cited

OTHER PUBLICATIONS

Jang et al., "A Divide-by-3 Injection Locked Frequency Divider With Single-Ended Input", IEEE Microwave and Wireless Components Letters, vol. 18, No. 2, Feb. 2008, pp. 142-144.

Lai et al., "Analytical Equations for Predicting Injection Locking in LC and Ring Oscillators", IEEE Custom Integrated Circuits Conference, 2005, pp. 461-464.

Lee et al., "A LC-Tank Injection Locked Frequency Divider With Complementary Structure", IEEE, 2007, 4 pages.

Lee et al., "A Low Power Injection Locked LC-Tank Oscillator With Current Reused Topology", IEEE Microwave and Wireless Components Letters, vol. 17, No. 3, Mar. 2007, pp. 220-222.

Lee et al., "A Wide Locking Range Differential Colpitts Injection Locked Frequency Divider", IEEE Microwave and Wireless Components Letters, vol. 17, No. 11, Nov. 2007, pp. 790-792.

Mazzanti et al., "Injection Locking LC Dividers for Low Power Quadrature Generation", IEEE Custom Integrated Circuits Conference, 2003, pp. 563-566.

Mirzaei et al."Injection-Locked Frequency Dividers Based on Ring Oscillators With Optimum Injection for Wide Lock Range", Symposium on VLSI Circuits Digest of Technical Papers, 2006, 2 pages.

Mirzaei, "Transient analysis of injection-locked frequency dividers", IEEE, 2002, pp. 381-384.

Motoyoshi et al., "43(micrometer]W 6GHz CMOS Divide-by-3 Frequency Divider Based on Three-Phase Harmonic Injection Locking", IEEE Asian, Solid-State Circuits Conference, Nov. 13-15, 2006, pp. 183-186.

Nakaska et al., "An Integrated 6.2-11 GHz SiGe Inductorless Injection Locked Frequency Divider", European Microwave Week, Paris, France, Oct. 2005, pp. 669-672.

Rategh et al., "Superharmonic Injection Locked Oscillators as Low Power Frequency Dividers", Symposium on VLSI Circuits Digest of Technical Papers, 1998, pp. 132-135.

Rategh et al., "A 5GHz, 32mW CMOS Frequency Synthesizer With an Injection Locked Frequency Divider", Symposium on VLSI Circuits Digest of Technical Papers, 1999, pp. 113-116.

Tong et al., "An Injection-Locked Frequency Divider With Multiple Highly Nonlinear Injection Stages and Large Division Ratios", IEEE Transactions on Circuits and Systems—11: Express Briefs, vol. 54, No. 4, Apr. 2007, pp. 313-317.

Wang et al., "10 Gb/s Single-Chip Data Regeneration With an Injection Synchronised Ring Oscillator and an Auitomatic Phase Adjustment", Conference Paper, 23rd European Solid-State Circuits Conference, Sep. 16-18, 1997, pp. 372-375.

Yu et al., "Odd phase switching prescaler based on Injection Locked Frequency Divider", Microwave Symposium, IEEE/MTT-S International, Honolulu, HI, Jun. 3-8, 2007, pp. 215-218.

* cited by examiner

FREQUENCY DIVIDER

BACKGROUND

Frequency dividers are used in a large number of applications and may be implemented as circuits in which the input frequencies are integer multiples of the output frequencies. The maximum input frequency and the power consumption can typically be of concerns with regard to the frequency divider. Injection-locked frequency dividers (ILFDs) can be implemented to divide high frequencies, consuming generally less power than conventional frequency dividers (CML, dynamic logic, etc.), as they operate at the output rate as opposed to the input frequency.

Conventional frequency dividers are based on latches and registers. The digital approach allows easy implementation of almost any kind of division ratio, including odd division moduli (e.g. 3, 5, and so forth). For example, a divide-by-3 register-based divider consists of two positive edge-triggered registers (flip-flop) and an AND gate. The output is low for two cycles and high for one cycle of the input signal. Other frequency dividers, such as divide-by-5 dividers, divide-by-7 dividers, and so forth, can be implemented with similar architecture. For instance, in a divide-by-7 divider, the output would be low for four cycles and high for three cycles of the input signal.

Different implementations of registers may be used for a frequency divider having static or dynamic power consumption characteristics and a maximum achievable operation frequency. For example, the frequency divider may be implemented as a MOS current mode logic (MCML), true single phase clock logic (TSPC), enhanced true single phase clock logic (E-TSPC), and so forth. The disadvantage of conventional frequency dividers is the power consumption, which rises with the increase of input frequency.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different instances in the description and the figures may indicate similar or identical items.

DETAILED DESCRIPTION OF THE INVENTION

Certain embodiments and implementations will be described with particular reference to the accompanying drawings. While the implementations will be described in conjunction with these drawings, it will be understood that they are not intended to be limiting.

According to one implementation, a divide-by-N frequency divider system, where N is an integer, includes a ring oscillator having M stages, where M is an integer, and a zero mean current component coupled to one or more of the stages to provide a zero mean current flow path. The ring oscillator is configured to receive an injection input signal. The frequency divider system may be used in the signal processing and communication technology areas, such as for use in radio frequency circuits, and may be implemented in a phase lock loop (PLL), a frequency synthesizer, or the like.

Figure 1:
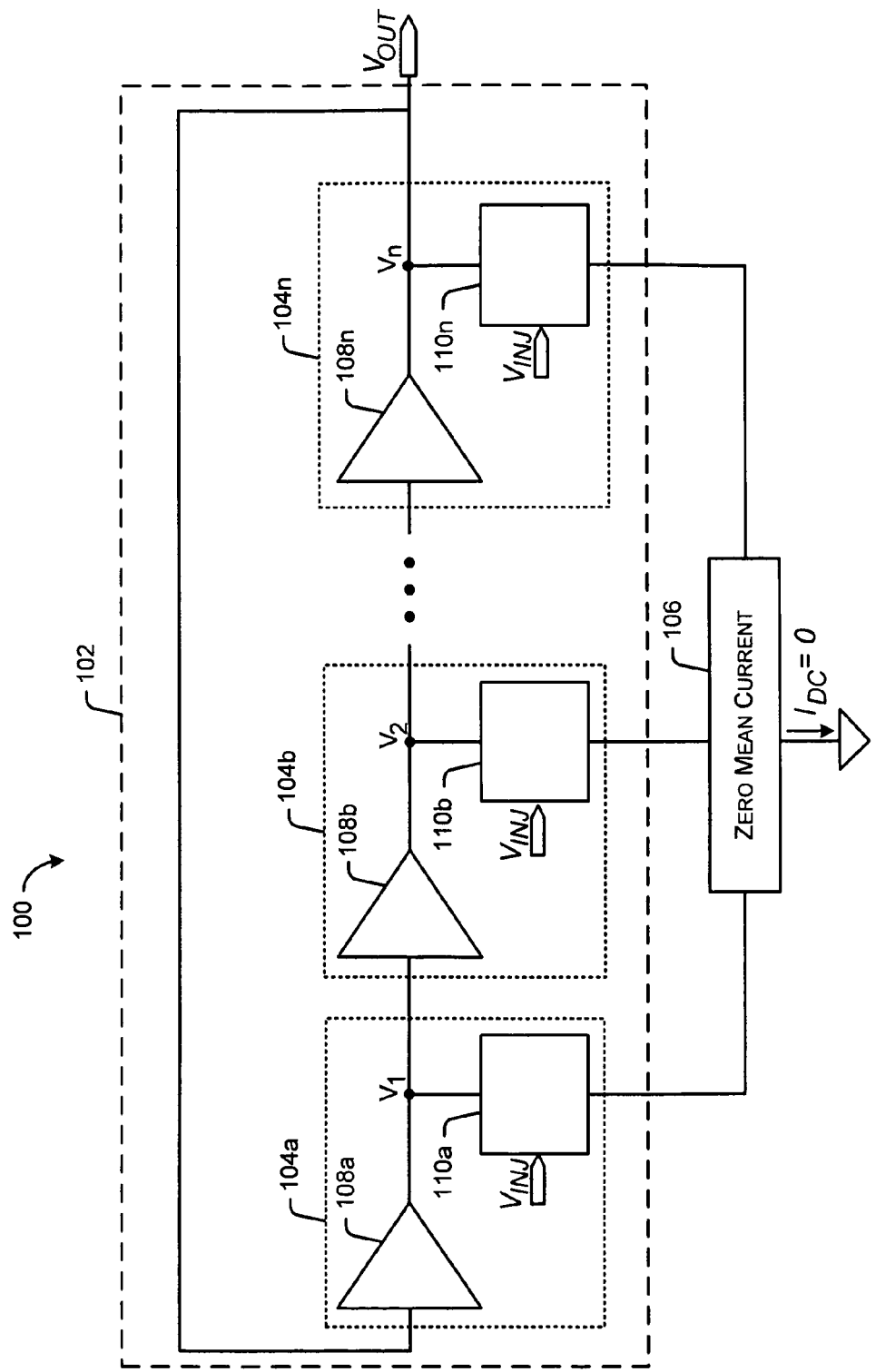
FIG. 1 is a simplified schematic diagram of one implementation of a frequency divider system.

FIG. 1 shows a divide-by-N frequency divider system 100. The system 100 includes a ring oscillator 102 having M stages 104$a$-$n$ and a zero mean current component 106 coupled to one or more of the stages 104$a$-$n$ to provide a zero mean current flow path. An input signal, $V_{INJ}$, is provided to system 100. The stages 104$a$-$n$ operate on the input signal by way of injection devices 110$a$-$n$ to provide an output signal, $V_{OUT}$, having a frequency that is a fraction of the input signal, $V_{INJ}$.

According to one implementation, the zero mean current component 106 comprises one or more capacitors, which may be coupled to, for example, 1, 3, 5, 7, 9, or other suitable number of stages 104$a$-$n$ and to ground, or DC voltage, to maintain a zero average or mean current. Alternatively, the zero current may be maintained by a battery or other suitable device. The zero mean current component 106 balances the current through the injection devices 110$a$-$n$, which may reduce the so-called pull down, pull up, or load effect of the injection devices 110$a$-$n$ on the ring oscillator 102 at nodes $V_1$, $V_2$, etc. Thus, the injection devices 110$a$-$n$ may be made larger (e.g., physically larger and/or having higher voltage) without significantly affecting the oscillation of the ring oscillator 102. By permitting larger injection devices 110$a$-$n$, the locking range of the ring oscillator 102 may be increased.

Each stage 104$a$-$n$ of the divide-by-N frequency divider system 100 includes a stage component 108$a$-$n$ and an injection device 110$a$-$n$, respectively. The stage components 108$a$-$n$ may each include an inverter or other suitable device and may serve as a buffer, delay stage, or may perform any other suitable frequency divider stage component function. The injection devices 110$a$-$n$ may each include a voltage or current injection device, such as a metal oxide semiconductor (MOS) device, coupled between at least one stage component 108$a$-$n$ and the zero mean current component 106. It may also include a phase-shifting network that delays the injection signal $V_{INJ}$. One or more of the injection devices 110$a$-$n$ may receive an injection voltage signal, $V_{INJ}$, and may provide an injected voltage signal to nodes $V_1$, $V_2$, $V_n$, and so forth, of the ring oscillator 102.

Figure 2:
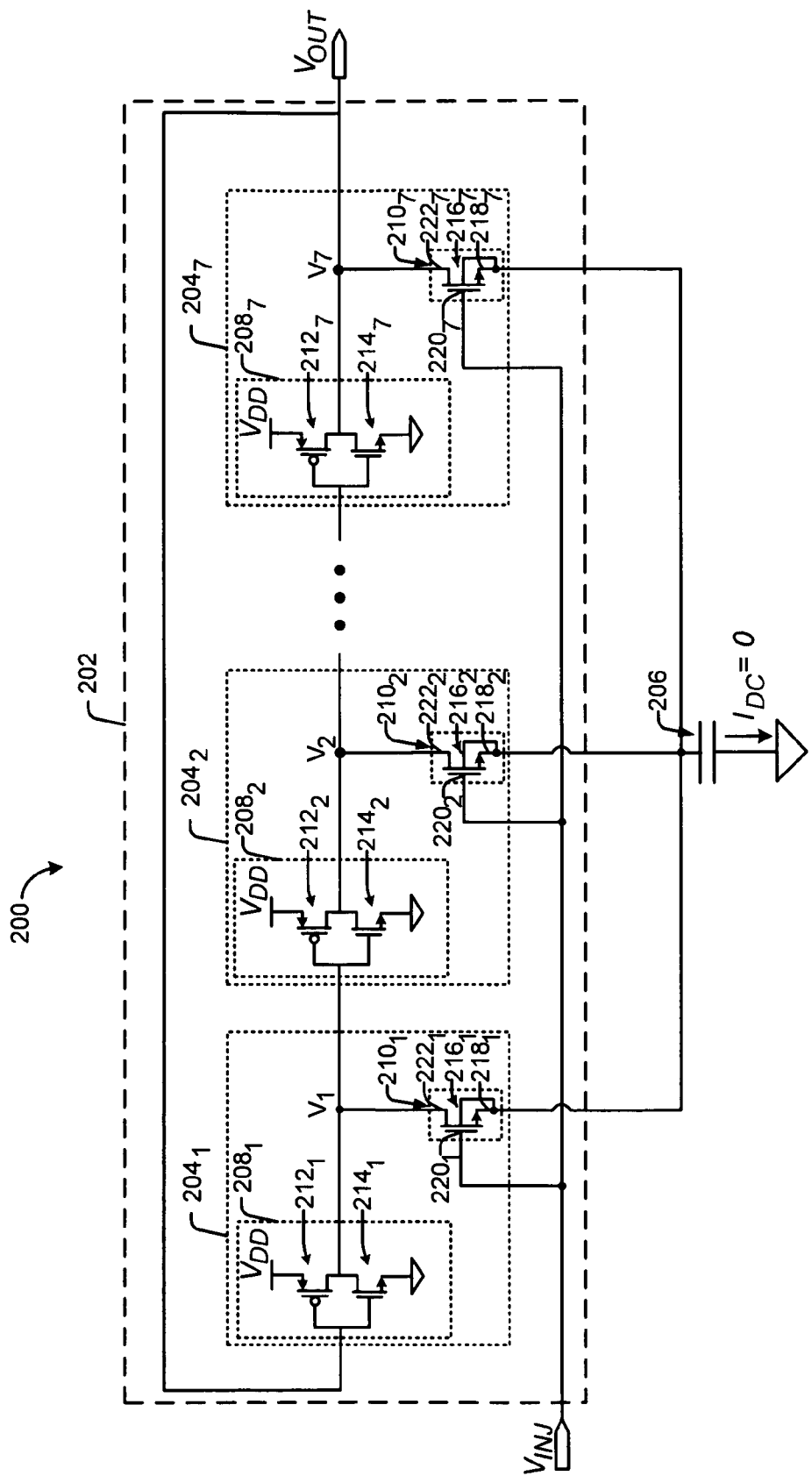
FIG. 2 is a simplified schematic diagram of another implementation of a frequency divider system.

FIG. 2 shows an example of a divide-by-7 frequency divider system 200. Stages 3-6 are omitted for the sake of simplicity. System 200 includes a ring oscillator 202 having 7 stages, 204$_1$-204$_7$, and a zero mean current component 206 coupled to one or more of the stages 204$_1$-204$_7$ to provide a zero mean current flow path. Stages 204$_1$-204$_7$ operate on the input signal, $V_{INJ}$, to provide an output signal, $V_{OUT}$, that has a frequency that is ⅐ of the frequency of the input signal, $V_{INJ}$.

Each of the stages 204$_{1-7}$ includes a stage component 208$_{1-7}$ and an injection device 210$_{1-7}$, respectively. For example, the stage component 208$_1$ includes a PMOS transistor 212$_1$ (coupled to voltage $V_{DD}$) and an NMOS transistor 214$_1$ (coupled to $v_{ss}$ or ground) coupled together to operate as a Complementary Metal Oxide Semiconductor (CMOS) inverter. The injection device 210$_1$ includes a MOS transistor device, such as an NMOS transistor 216$_1$. Although an NMOS transistor $216_1$ is shown, it is appreciated that a PMOS transistor may alternatively be used. The injection devices $210_{1-7}$ may be connected to each of the internal nodes (at $V_1$, $V_2$, $V_7$, etc.) of the ring oscillator to maximize the locking range for the ring oscillator 202.

The source $218_1$ of the NMOS transistor $216_1$ is coupled to the zero mean current component 206, shown here as a single capacitor. The zero mean current component 206 is used to force a zero mean current flow through the NMOS transistors $216_{1-7}$ of the injection devices $210_{1-7}$. The gates $220_{1-7}$ of the transistors $216_{1-7}$ are configured to receive the injection voltage signal, $V_{INJ}$, which may be the signal to be divided or a signal derived from it. The drains $222_{1-7}$ of the NMOS transistors $216_{1-7}$ are coupled to internal nodes of the ring oscillator 202.

The injection devices $210_{1-7}$, and more particularly NMOS transistors $216_{1-7}$, provide a mixing operation between the injected signal, $V_{INJ}$, and the proper harmonic of the fundamental frequency of the oscillator at an internal node of the ring oscillator 202. More particularly, mixing between the injected signal frequency and the (N−1)th and/or the (N+1)th harmonic of the fundamental frequency of the oscillator provides the necessary frequency shift to enable the locking and hence the frequency division.

Figure 3:
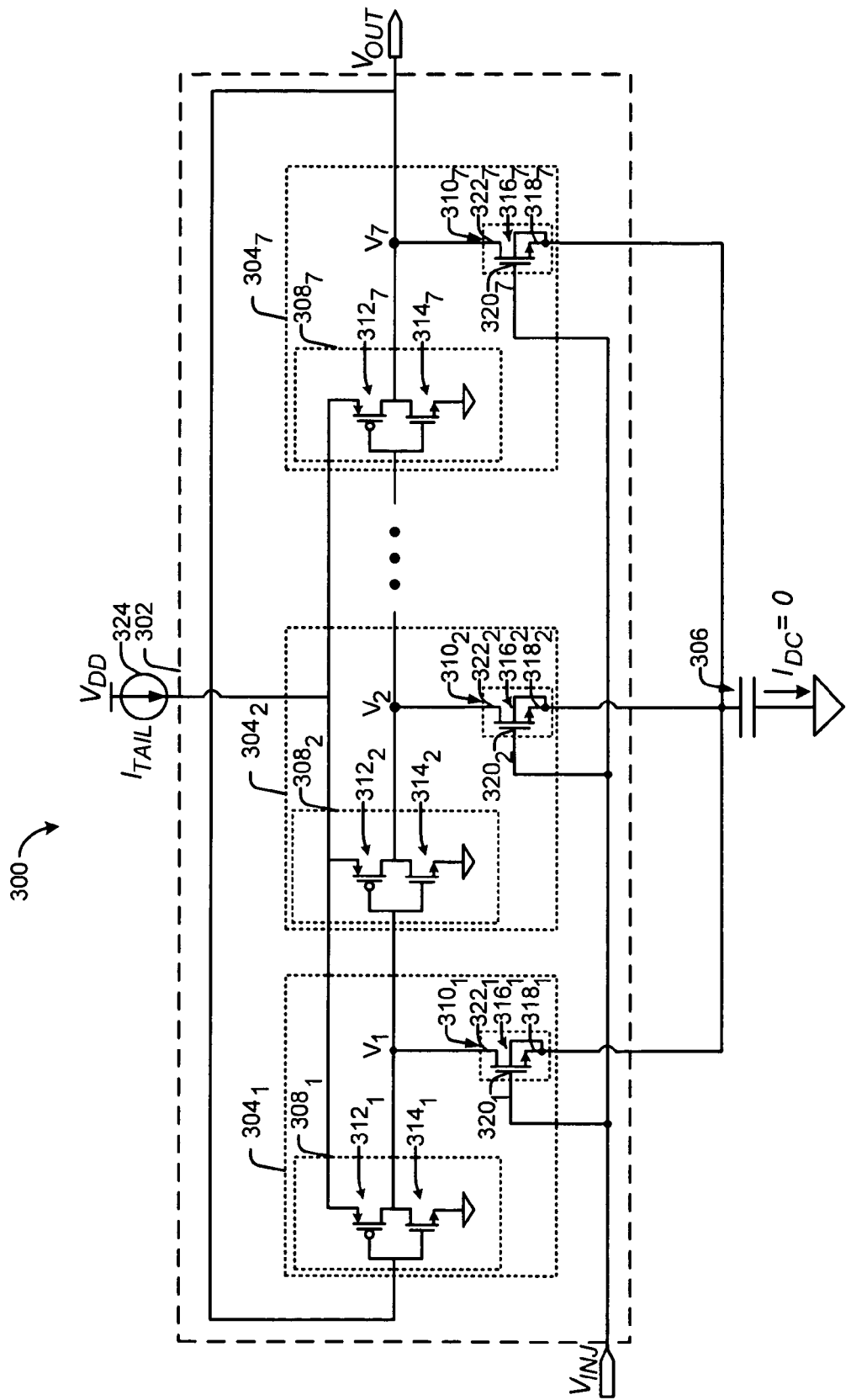
FIG. 3 is a simplified schematic diagram of another implementation of a frequency divider system.

FIG. 3 shows a system 300, similar to system 200, but also having a so-called tail current source 324. The tail current source 324 provides a tail current $I_{TAIL}$ to each of the stages $304_{1-7}$ in order to improve robustness of the system with respect to process variations and other device or operating inconsistencies. More particularly, in the absence of a tail current source, if $V_{DD}$ in a given ring oscillator changes, the center frequency of the oscillator also changes, which may lead to an undesired result, such as locking to a frequency different than the desired frequency. Coupling the tail current $I_{TAIL}$ as show in FIG. 3, the circuit is made independent of the value of $V_{DD}$.

Figure 4:
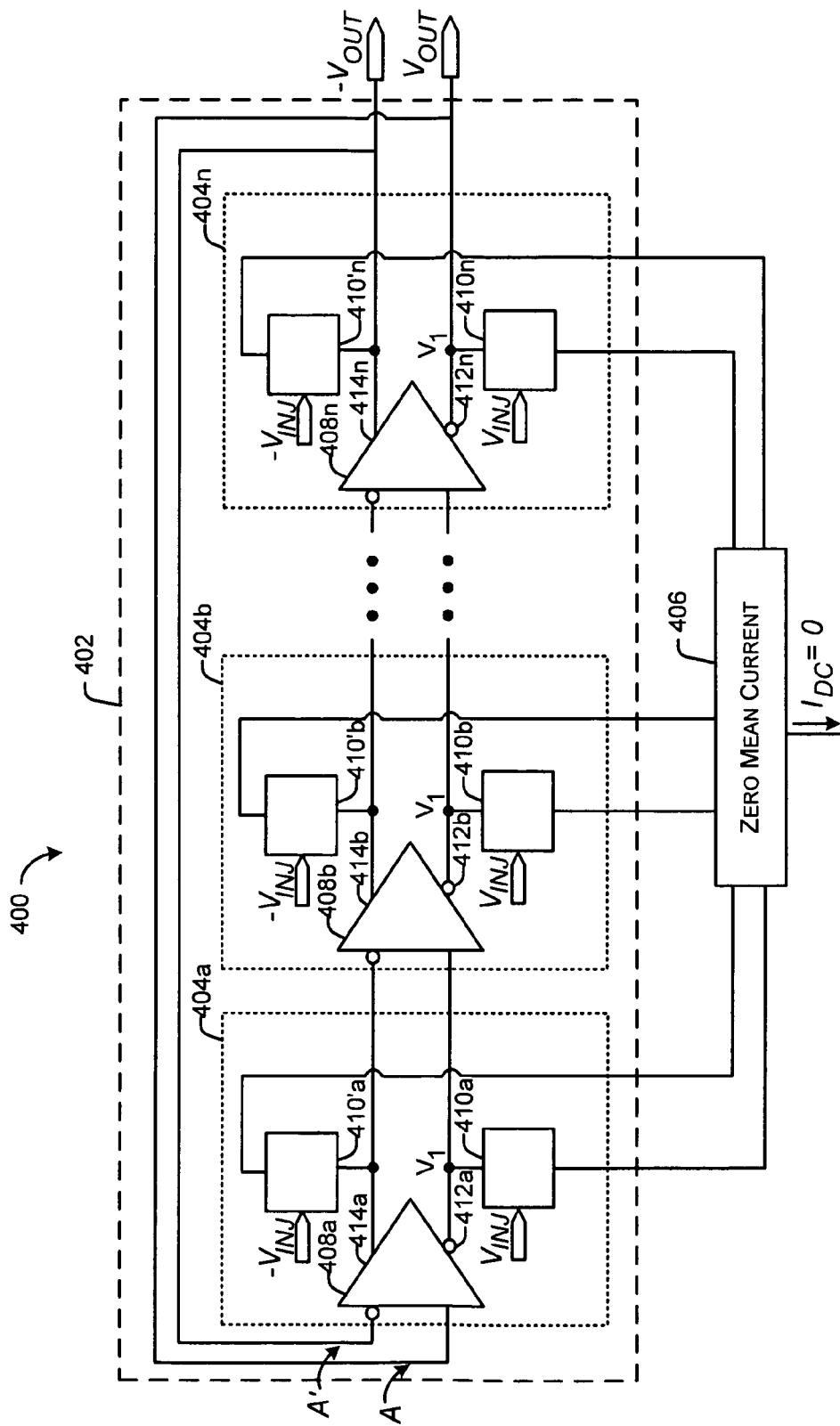
FIG. 4 is a simplified schematic diagram of a differential implementation of a frequency divider system.

FIG. 4 shows a divide-by-N frequency divider system 400, generally similar to system 100, but having differential inputs and outputs. The portion of the circuit extending from A to $V_{OUT}$ is essentially identical to the circuit shown in FIG. 1. The portion of the circuit extending from A' to $-V_{OUT}$ is also essentially identical to the circuit shown in FIG. 1 except that this portion is operated at an opposite phase to the portion of the circuit extending from A to $V_{OUT}$. Each of the stage components 408a-n is coupled to a first injection device 410a-410n and a second injection device 410'a-410'n. For example, the first injection device 410a is coupled between a first output 412a of the stage component 408a and a zero mean current component 406. The second injection device 410'a is coupled between a second output 414a of the stage component 408a and the zero mean current component 406.

Figure 5:
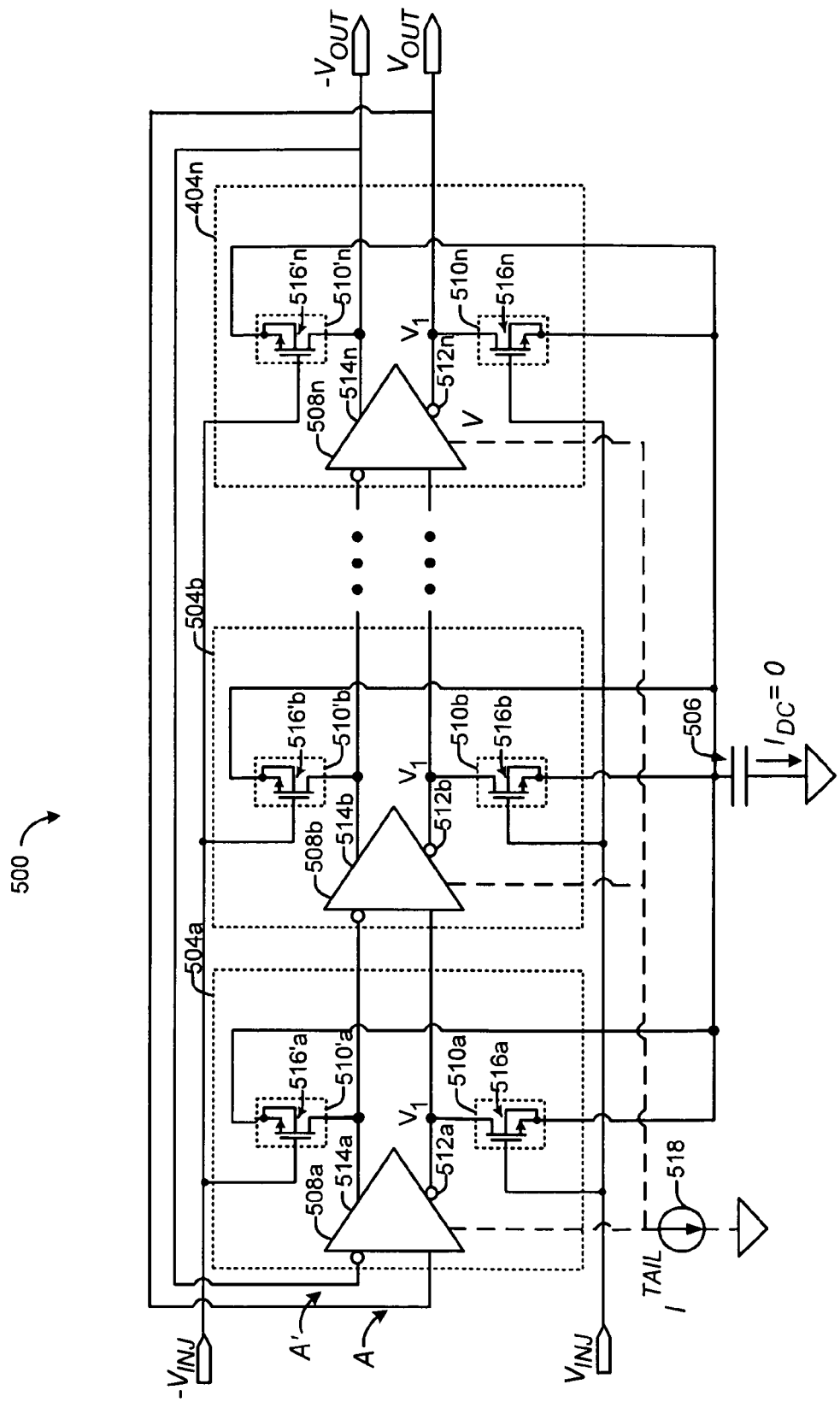
FIG. 5 is a simplified schematic diagram of another differential implementation of a frequency divider system.

FIG. 5 shows a divide-by-N frequency divider system 500, generally similar to system 200, but having differential inputs and outputs. The portion of the circuit extending from A to $V_{OUT}$ is essentially identical to the circuit shown in FIG. 2. The portion of the circuit extending from A' to $-V_{OUT}$ is also essentially identical to the circuit shown in FIG. 2, except that this potion is operated at an opposite phase to the portion of the circuit extending from A to $V_{OUT}$. Thus, each of the stage components 508a-n is coupled to a first injection device 510a-n and a second injection device 510'a-n, respectively. The first injection device 510a-n is coupled between a first output 512a-n of the stage component 508a-n, respectively, and a zero mean current component 506. The second injection device 510'a-n is coupled between a second output 514a-n of the stage component 508a-n, respectively, and the zero mean current component 506. As with system 300, shown in FIG. 3, according to some implementations (as represented by the dashed line), a tail current source 518 may provide a tail current $I_{TAIL}$ or otherwise maintain a desired current to one or more of the stage components 508a-n. The stage component 508a-n may be a differential delay stage or inverter, as shown in FIG. 6.

Figure 6:
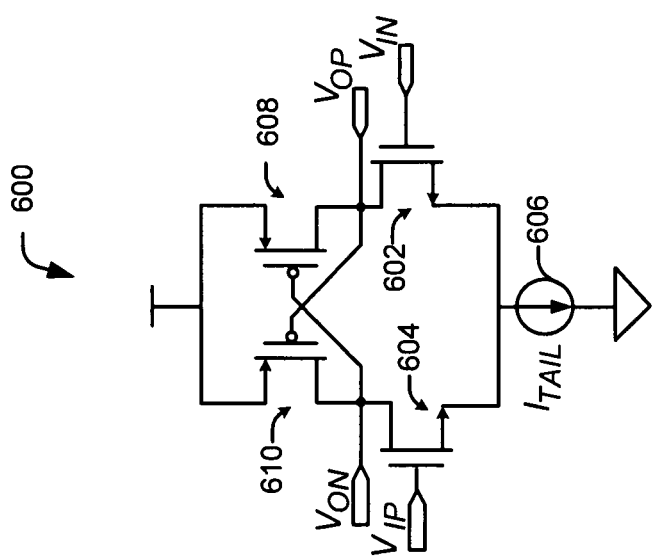
FIG. 6 is a simplified schematic diagram of a differential delay stage component.

FIG. 6 shows an exemplary differential delay stage 600, which may be used as one or more of the stage components 508a-n. Differential signals are applied as input signals $V_{IP}$ and $V_{IN}$ to transistors 602 and 604, respectively. $V_{IP}$ and $V_{IN}$ may correspond to A and A', respectively. As with system 300, shown in FIG. 3, a tail current source 606 may provide a tail current $I_{TAIL}$ or otherwise maintain a desired current to the differential delay stage 600. The tail current source 606 may also be connected between several of the stages in order to provide a tail current $I_{TAIL}$, or otherwise maintain a desired current, to a system, e.g. system 500, thereby reducing the effects of process variations and other device inconsistencies, as described above. Transistors 602 and 604 are coupled to transistor 608 and 610, respectively, to provide output signals $V_{OP}$ and $V_{ON}$, which may correspond to $V_{OUT}$ and $-V_{OUT}$, respectively.

Exemplary Process

Specifics of exemplary methods are described below. However, it should be understood that certain acts need not be performed in the order described, and may be modified, and/or may be omitted entirely, depending on the circumstances. Moreover, the acts described may be carried out in part using a computer, processor or other computing device based on instructions stored on one or more computer-readable media. The computer-readable media can be any available media that can be accessed by a computing device to implement the instructions stored thereon.

Figure 7:
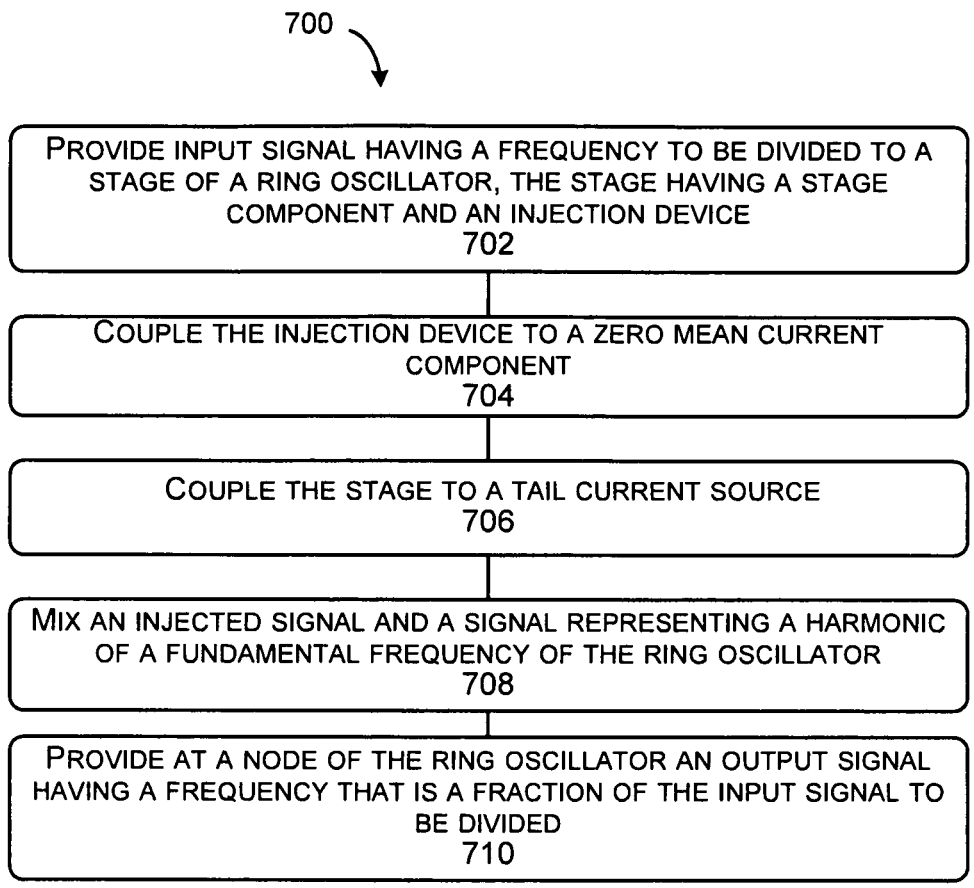
FIG. 7 is a flow diagram of a method for dividing a frequency of a signal.

FIG. 7 illustrates one example implementation of a process 700 for dividing the frequency of a signal. The method will be described with reference to FIG. 3, though merely for sake of convenience; the method is not intended to be limited by this exemplary implementation.

At 702, an input signal to be divided is provided to a stage of a ring oscillator. For example, $V_{INJ}$ may be provided to first stage $304_1$. The stage $304_1$ may have a stage component $308_1$ and an injection device $310_1$.

At 704, the injection device may be coupled to a zero mean current component. For example, injection device $310_1$ may be coupled to zero mean current component 306, which may be a capacitor, battery, or other device for maintaining a zero mean current path.

At 706, the stage may be coupled to a tail current source. For example, stage $304_1$ maybe coupled to a tail current source 324. The tail current source 324 may also be connected between several of the stages in order to provide a tail current $I_{TAIL}$, or otherwise maintain a desired current, to the system 300, thereby reducing the effects of process variations and other device inconsistencies, as described above.

At 708, an injected signal is mixed, using the injection device, with a harmonic signal of a fundamental frequency of the ring oscillator. For example, the injection device $310_1$ may receive $V_{INJ}$ and mix it with a harmonic signal of a fundamental frequency of the ring oscillator, such as the signal output by the stage $304_1$.

At 710, an output signal is provided at a node of the ring oscillator. The output signal has a frequency that is a fraction of the frequency input signal to be divided. For example, a signal maybe provided by the injection device $310_1$ at node V1, where the frequency of V1 is a fraction of the frequency of the input signal $V_{INJ}$. For example, if the stage is one of M stages of the ring oscillator, the output signal is a 1/N fraction of the input signal to be divided, where M is different from N. According to one implementation, N is equal to M.

Exemplary Environment

Figure 8:
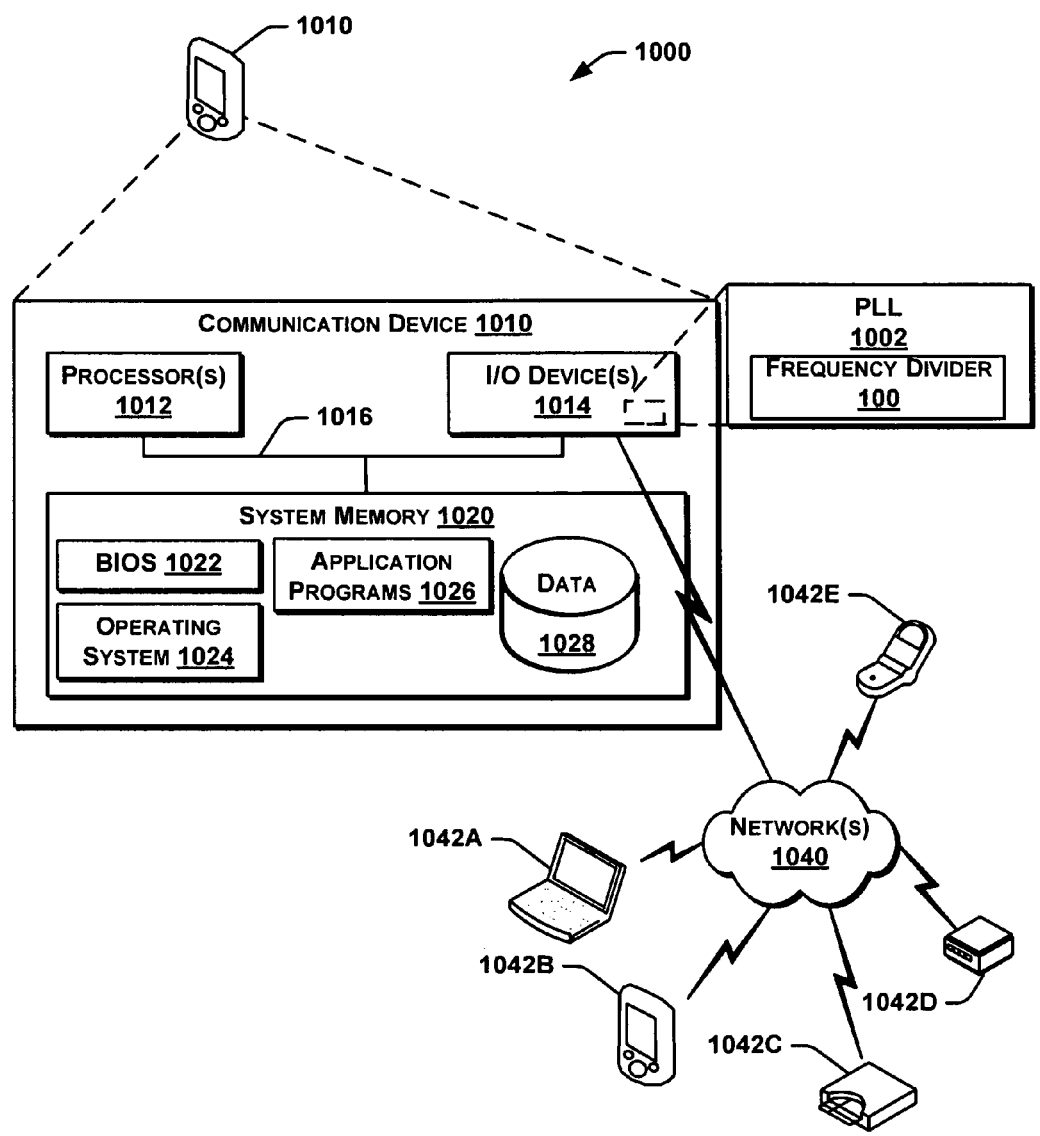
FIG. 8 is an exemplary environment in which techniques in accordance with the present disclosure may be implemented.

FIG. 8 illustrates an exemplary environment 1000 in which techniques in accordance with the present disclosure may be implemented. In this implementation, the environment 1000 includes a communication device 1010, or other mobile and/or electronic device, having one or more phase lock loop (PLL) circuit(s) 1002 that incorporates a frequency divider (e.g., frequency divider system 100) configured in accordance with the teachings of the present disclosure to provide an output signal that is a fraction of an input signal. The PLL circuit 1002 may include other components that operate to provide a phase lock function; however, these components are not shown for the sake of simplicity. The communication device 1010 operatively communicates via one or more networks 1040, such as wireless local area network (WLAN), with a plurality of other devices 1042. Alternatively, the communication device 1010 may bypass the networks 1040 and communicate directly with one or more of the other devices 1042.

In the representative environment 1000, the communication device 1010 is a hand-held device, such as an MP3 (Moving Picture Exerts Group Layer-3) player, a personal data assistant (PDA), a global positioning system (GPS) unit, mobile telephone, smartphone, or other similar hand-held device, and the other devices 1042 may include, for example, a computer 1042A, another hand-held device 1042B, a compact disc (CD) or digital video disc (DVD) player 1042C, a signal processor 1042D (e.g., radio, navigational unit, television, etc.), and a mobile phone 1042E. In alternate implementations, of course, the devices 1010, 1042 may include any other suitable devices, and it is understood that any of the plurality of devices 1042 may be equipped with PLL 1002 and/or frequency divider system 100 that operate in accordance with the teachings of the present disclosure.

As further shown in FIG. 8, the communication device 1010 includes one or more processors 1012 and one or more input/output (I/O) devices 1014 (e.g., transceivers, transmitters, receivers, etc.) coupled to a system memory 1020 by a bus 1016. In the implementation shown in FIG. 8, the frequency divider system 100 is included as a component within the I/O devices 114 of the communication device 110. In alternate implementations, however, the frequency divider system 100 may be integrated with any other suitable portion of the device 1010, or may be a separate, individual component of the device 1010.

The system bus 1016 of the communication device 1010 represents any of the several types of bus structures, including a memory bus or memory controller, a peripheral bus, an accelerated graphics port, and a processor or local bus using any of a variety of bus architectures. The I/O component 1014 may be configured to operatively communicate with one or more external networks 1040, such as a cellular telephone network, a satellite network, an information network (e.g., Internet, intranet, cellular network, cable network, fiber optic network, LAN, WAN, etc.), an infrared or radio wave communication network, or any other suitable network.

The system memory 1020 may include computer-readable media configured to store data and/or program modules for implementing the techniques disclosed herein that are immediately accessible to and/or presently operated on by the processor 1012. For example, the system memory 1020 may also store a basic input/output system (BIOS) 1022, an operating system 1024, one or more application programs 1026, and program data 1028 that can be accessed by the processor 1012 for performing various tasks desired by a user of the communication device 1010.

Moreover, the computer-readable media included in the system memory 1020 can be any available media that can be accessed by the device 1010, including computer storage media and communication media. Computer storage media may include both volatile and nonvolatile, removable and non-removable media implemented in any method or technology for storage of information such as computer-readable instructions, data structures, program modules, or other data. Computer storage media includes, but is not limited to, and random access memory (RAM), read only memory (ROM), electrically erasable programmable ROM (EEPROM), flash memory or other memory technology, compact disk ROM (CD-ROM), digital versatile disks (DVD) or other optical disk storage, magnetic cassettes, magnetic tape, magnetic disk storage or other magnetic storage devices, or any other medium, including paper, punch cards and the like, which can be used to store the desired information and which can be accessed by the communication device 1010.

Similarly, communication media typically embodies computer-readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection and wireless media such as acoustic, RF, infrared and other wireless media. Combinations of any of the above should also be included within the scope of computer readable media.

Generally, program modules executed on the device 1010 may include routines, programs, objects, components, data structures, etc., for performing particular tasks or implementing particular abstract data types. These program modules and the like may be executed as a native code or may be downloaded and executed such as in a virtual machine or other just-in-time compilation execution environments. Typically, the functionality of the program modules may be combined or distributed as desired in various implementations.

Although the exemplary environment 1000 is shown as in FIG. 8 as a communication network, this implementation is meant to serve only as a non-limiting example of a suitable environment for use of the frequency divider system 100 in accordance with present disclosure. Similarly, the device 1010 is simply one non-limiting example of a suitable device that may include frequency divider system 100 in accordance with the present disclosure.

Conclusion

Although the subject matter has been described in language specific to structural features and/or methodological acts, it is to be understood that the subject matter defined in the appended claims is not necessarily limited to the specific features or acts described. Rather, the specific features and acts are disclosed as preferred forms of implementing the claims.

What is claimed is:

1. A divide-by-N frequency divider system, where N is an integer, comprising:
a ring oscillator having M stages, where M is an integer, the ring oscillator configured to receive an injection input signal and provide an output signal, and each of the M stages have a single input and a single output configured, respectively, to receive an output from its preceding stage in the ring and to provide an input to its succeeding stage in the ring; and a zero mean current component coupled to one or more of the stages to provide a zero mean current flow path, wherein each M stage comprises a Complementary Metal Oxide Semiconductor (CMOS) inverter and at least one transistor coupled between the CMOS inverter and the zero mean current component, the at least one transistor comprising a gate, source, and drain, the gate configured to receive an injection voltage, the source coupled to the zero mean current component, and the drain coupled to a node of the ring oscillator.

2. The divide-by-N frequency divider system according to claim 1 wherein the zero mean current component comprises one or more capacitors.

3. The divide-by-N frequency divider system according to claim 1, wherein N is equal to M.

4. The divide-by-N frequency divider system according to claim 1, wherein at least one of N or M is equal to 7.

5. The divide-by-N frequency divider system according to claim 1, wherein N is an integer greater than 1, and wherein each of the stages is coupled to a tail current source.

6. The divide-by-N frequency divider system according to claim 1, wherein the output signal has a frequency equal to 1/N of the injection input signal to be divided, where M is different than N.

7. The divide-by-N frequency divider system according to claim 1, wherein the output signal has a frequency equal to 1/N of the injection input signal to be divided, where M is equal to N.

8. The divide-by-N frequency divider system according to claim 1 further comprising at least one tail current source coupled to at least one stage of the ring oscillator.

9. A divide-by-N frequency divider system, where N is an integer, comprising:

a ring oscillator having M stages, where M is an integer, the ring oscillator configured to receive an injection input signal and provide an output signal; and a zero mean current component coupled to one or more of the stages to provide a zero mean current flow path;

wherein the ring oscillator is a differential ring oscillator, and each of the M stages comprises:

a stage component having a first output terminal and a second output terminal:

a first injection device coupled between the first output terminal of the stage component and the zero mean current component; and a second injection device coupled between the second output terminal of the stage component and the zero mean current component.

10. A frequency divider system comprising:

a plurality of stages, each stage including a stage component and an injection device coupled to the stage component; and a zero mean current component coupled to the injection device to provide a zero mean current flow path;

wherein the stage component is a differential delay stage having a first output terminal and a second output terminal, and wherein the injection device is a first injection device coupled between the first output terminal of the stage component and the zero mean current component, the stage component further comprising a second injection device coupled between the second output terminal of the stage component and the zero mean current component.

* * * * *